(12) United States Patent
Shimada

(10) Patent No.: US 6,365,963 B1
(45) Date of Patent: Apr. 2, 2002

(54) STACKED-CHIP SEMICONDUCTOR DEVICE

(75) Inventor: Toshiyasu Shimada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/648,272

(22) Filed: Aug. 25, 2000

(30) Foreign Application Priority Data

Sep. 2, 1999 (JP) .......................................... 11-248217

(51) Int. Cl.[7] .............................................. H01L 23/02
(52) U.S. Cl. ....................... 257/686; 257/777; 257/698; 257/723
(58) Field of Search ................................ 257/777, 778, 257/685, 686, 698, 723, 724

(56) References Cited

U.S. PATENT DOCUMENTS

| 5,808,878 A | * | 9/1998 | Saito et al. |
| 5,869,894 A | * | 2/1999 | Degani et al. |
| 6,181,008 B1 | * | 1/2001 | Avery et al. |

FOREIGN PATENT DOCUMENTS

| JP | 2-126685 | * | 5/1990 |
| JP | 5-129516 | * | 5/1993 |

* cited by examiner

*Primary Examiner*—Sheila V. Clark
(74) *Attorney, Agent, or Firm*—Michael Best & Friedrich LLC; Laff, Whitesel & Saret, Ltd.; J. Warren Whitesel

(57) ABSTRACT

A stacked-chip semiconductor device includes a rigid insulator board having therein a central opening and thereon a wiring pattern, and a base insulator bonded to the rigid insulator board and having a wiring pattern. Both the wiring patterns are connected together via through-holes formed in the rigid insulator board. A first semiconductor chip is mounted on the base insulator film within the opening of the rigid insulator board, whereas a second semiconductor chip is mounted on the rigid insulator board overlying the opening.

7 Claims, 6 Drawing Sheets

STACKED-CHIP SEMICONDUCTOR DEVICE

BACKGROUND OF THE INVENTION (a) Field of the Invention

The present invention relates to a stacked-chip semiconductor device and, more particularly, to the structure of the stacked-chip semiconductor device having a smaller thickness.

(b) Description of the Related Art

With development of higher functions of the electronic device, demand for higher integration of semiconductor elements constituting the electronic device has increased. For achievement of the higher integration, it may be considered preferable that a plurality of ICs, such as including a logic IC and a memory IC, be integrated on a single chip. However, this type of integration complicates the fabrication process as well as the electric tests of the chip, to thereby raise the costs of the electronic device. Thus, it is usual that a plurality of chips, typically two chips, be stacked in a single package for a higher integration without raising the costs.

FIG. 1 shows a conventional stacked-chip structure of a semiconductor device wherein a first semiconductor chip (first chip) 202 is mounted on a packaging board 201 and then a second chip 203 is stacked onto the first chip 202 with an intervention of an adhesive insulator layer disposed therebetween. The first chip 202 is generally larger than the second chip 203 in the planar dimensions. Bonding wires 204 made of gold (Au) connect the chip electrodes of the first and second chips 202 and 203 and the internal electrode pads 206 formed on the top surface of the packaging board 201. Mold resin 205 encapsulates the entire chips 202 and 203 and the bonding wires 204 for protection against mechanical damages or contamination.

The bottom surface of the packaging board 201 mounts thereon external electrode pads 208 connected to the internal electrode pads 206 by wiring layer 207. A solder ball 209 is formed on each external electrode pad 208, and used for mounting the stacked-chip semiconductor device on a mounting board not shown in the figure.

In the structure shown in FIG. 1, there is a restriction in which the underlying first chip 202 must be larger than the overlying second chip 203. Otherwise, an overhang state of the overlying second chip 203 is subjected to damages during the wire bonding step for the chips 202 and 203 due to a pressure rise caused by the wire bonding process.

In addition, the overall height or thickness of the semiconductor device is undesirably large due to the combination of the stacked-chip structure and the location of the external solder bumps 209.

FIG. 2 shows another conventional stacked-chip structure of a semiconductor device, wherein the first chip 303 is mounted on a packaging board 301 in a depression 302 formed in the packaging board 301, and the second chip 307 is stacked onto the first chip 303 with an intervention of resin 306 disposed therebetween. The resin 306 is also filled in the depression 302 around the first chip 303. The second chip 307 is larger than the first chip 301 and the depression 302, and thus the second chip 307 is mounted on the top surface of the packaging board 301 above the first chip 301.

The first chip 303 is mounted by a flip-chip bonding technique using internal electrode pads 304 formed on the bottom of the depression 302 and Au bumps 305 formed on the first chip 303. The second chip 307 is also mounted by a flip-chip bonding technique using internal electrode pads 308 formed on the top surface of the packaging board 301 and Au bumps 309 formed on the second chip 307. External electrode pads 311 are formed on the peripheral area of the top surface of the packaging board 301, and solder balls 312 are formed on the external electrode pads 311.

In the conventional device of FIG. 2, there is an advantage in that the overall height of the stacked structure is reduced compared to the conventional device of FIG. 1. However, the process for forming the depression 302 by counterboring on the packaging board 301 raises the cost of the packaging board 301. In addition, the depression 302 also reduces the mechanical strength of the packaging board 301 and may cause a warp of the packaging board 301.

SUMMARY OF THE INVENTION

It is therefore an object of the present invention to provide a new stacked-chip structure of a semiconductor device, which is capable of reducing the height or thickness of the semiconductor device.

The present invention provides a stacked-chip semiconductor device including a rigid insulator board having a first wiring pattern formed on a top surface thereof and an opening formed therein, a base insulator film having a top surface bonded onto a bottom surface of the rigid insulator board, the top surface of the base insulator film mounting thereon a second wiring pattern electrically connected to the first wiring pattern, a first semiconductor chip mounted on the top surface of the base insulator film and received in the opening, the first semiconductor chip having chip electrodes electrically connected to the second wiring pattern, and a second chip mounted on the rigid insulator board overlying the opening and chip electrodes connected to the first wiring pattern, the first wiring pattern including external electrode pads.

In accordance with the stacked-chip semiconductor device of the present invention, the combination of the rigid insulator board and the base insulator film affords a smaller thickness of the semiconductor device substantially without reducing the overall mechanical strength of the semiconductor device.

The above and other objects, features and advantages of the present invention will be more apparent from the following description, referring to the accompanying drawings.

PREFERRED EMBODIMENT OF THE INVENTION

Figure 1:
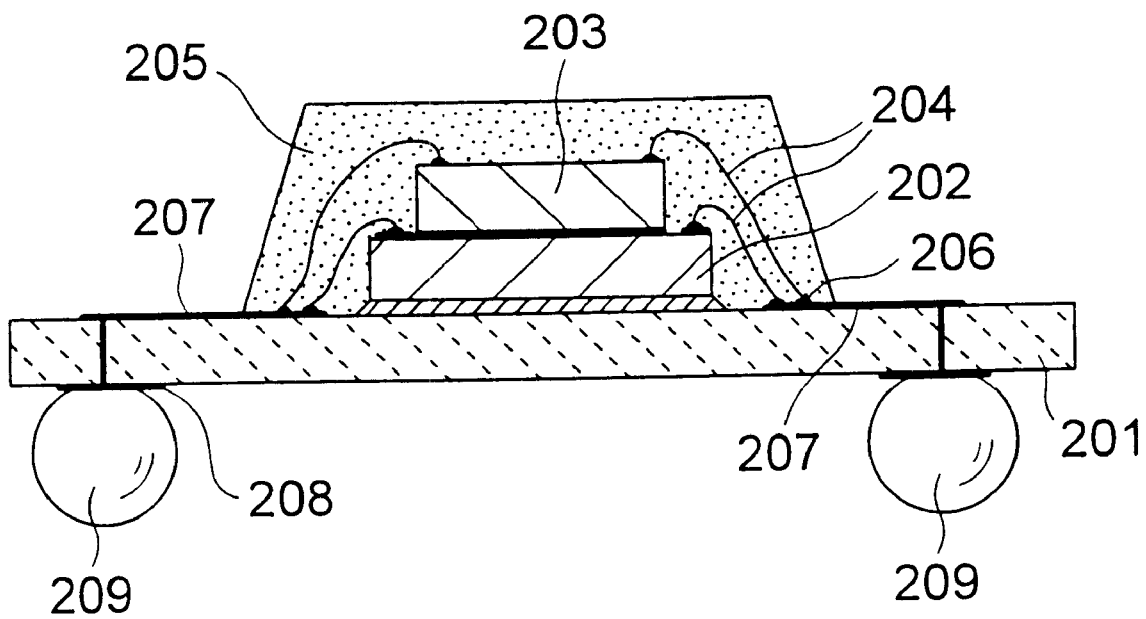
FIG. 1 is a sectional view of a conventional stacked-chip semiconductor device.

Now, the present invention is more specifically described with reference to accompanying drawings, wherein similar constituent elements are designated by related reference numerals.

Figure 3:
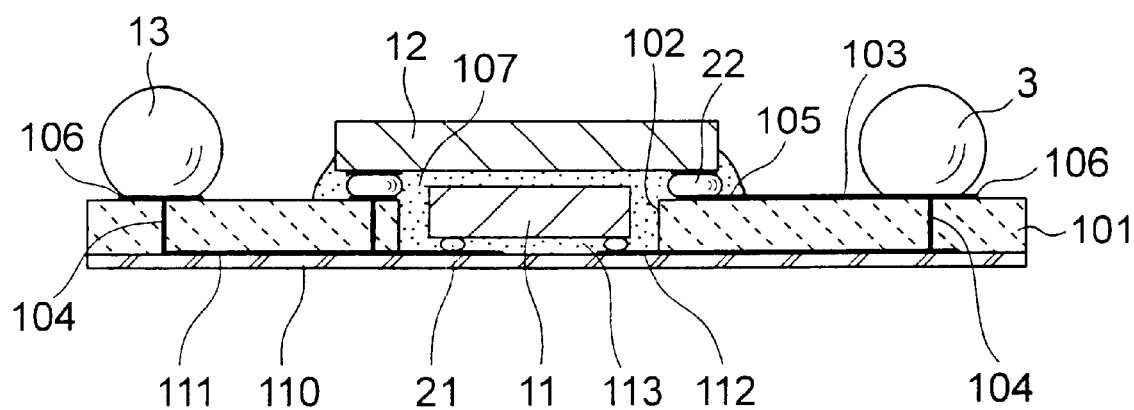
FIG. 3 is a sectional view of a stacked-chip semiconductor device according to a first embodiment of the present invention.

Referring to FIG. 3, a stacked-chip semiconductor device according to a first embodiment of the present invention includes a rigid insulator board 101 and a base insulator film 110 underlying the rigid board 101. The rigid board 101 has a central opening therein for receiving therein a first chip 11 which is mounted on the base insulator film 110 with an intervention of resin 113. A second chip 12 is stacked onto the first chip 11 with an intervention of resin 107 disposed therebetween.

The rigid board 101 is made of ceramics or hard resin having a thickness of 0.4 mm, for example, which is comparable to the thickness of the first chip 11. The opening 102 is of a square having a side of 9 mm. A wiring pattern 103 formed on the rigid board 101 is connected via through-holes 104 formed in the rigid board 101 to a wiring pattern 111 formed on the base film 110. The wiring pattern 103 and the via-plugs in the through-holes 104 are formed by printing or metallization.

Internal electrode pads 105 are formed on the rigid board 101 as part of the wiring pattern 103 in the vicinity of the opening 102. The electrode pads 15 are used for mounting the second chip 12 having chip electrodes formed thereon. External electrode pads 106 are also formed on the rigid board 101 as part of the wiring pattern 103 in the vicinity of the outer periphery of the rigid board 101.

The base film 110 mounting thereon the first chip 11 is made of polyimide resin having a thickness of 50 to 100 micrometers. The wiring pattern 111 made of a conductive film, such as Cu film, includes internal electrode pads 112 for mounting the first chip 11, which has chip electrodes and Au bumps 21 formed thereon. The Au bumps 21 and the electrode pads 112 are used for mounting the first chip 11 on the base film 110 by using a flip-chip bonding technique.

The base film 110 is bonded onto the bottom surface of the rigid board 101 so that the through-holes 104 are aligned with corresponding interconnects of the wiring pattern 111 formed on the base film 110. The first chip 11 is mounted on the base film 110 at the center of the opening 102 formed in the rigid board 101.

The second chip 12 of a 12×12 mm planar shape is mounted on the rigid board 101 so that the second chip 12 overlies the opening 102. The Au bumps 22 formed on the second chip 12 is connected to the electrode pads 105 on the rigid board 101 by a flip-chip boding technique. Resin 107 is cast between the second chip 12 and the rigid board 101 and in the opening 102 for reinforcing the mechanical strength of the rigid board 101 and preventing contamination of the semiconductor chips. Solder balls 13 are formed on the external electrode pads 106 disposed in the vicinity of the outer periphery of the rigid board 101. In an alternative, the solder balls 13 may be replaced by external pins. Each of the solder balls 13 has a top higher than the top of the second chip 12. The solder balls 13 are used for mounting the semiconductor device on a mounting board (not shown) which is to be disposed on top of the solder balls 13.

Figure 4A:
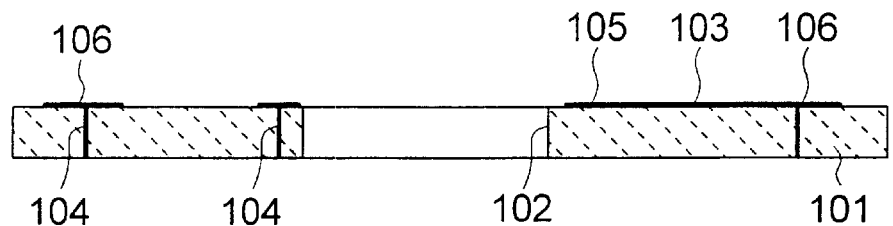
FIGS. 4A to 4D are sectional views of the stacked-chip semiconductor device of FIG. 1 during consecutive steps of a fabrication process therefor.
Figure 4B:
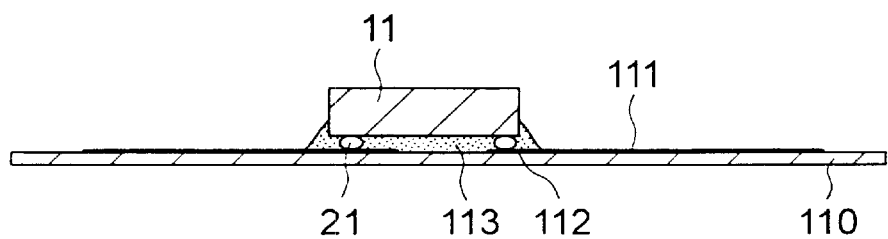

Referring to FIGS. 4A to 4B, a method for fabricating the semiconductor device of FIG. 3 will be described below. In FIG. 4A, the rigid board 101 is made of a 0.4-mm-thick ceramic plate. An opening 102 of a 9×9 mm square is formed at the center of the rigid board 101, followed by formation of through-holes 104 penetrating therethrough and a wiring pattern 103 on the top surface thereof. The wiring pattern 103 and the via-plugs in the through-holes 104 are formed by metallization. The wiring pattern 103 includes interconnects, internal electrode pads 105 for the second chip 12 and the external electrode pads 106 for the solder balls 13. The ceramic plate for the rigid board 101 may be replaced by a hard resin plate.

In FIG. 4B, the base film 110 is made of 50-$\mu$m-thick polyimide on which a wiring pattern 111 made of Cu film is formed. The wiring pattern 111 includes interconnects and internal electrode pads 12 onto which Au bumps 21 of the first chip 11 is bonded. The Au bumps 21 are formed by cutting Au wires, bonded onto the electrode pads of the first chip 11, in the vicinities of the bonding. The Au bumps 21 of the first chip 11 is bonded onto electrode pads 112 of the base film 111 by a heat-press bonding technique, after the first chip 11 is positioned on the base film 11, with the top surface of the first chip 11 directed downward, or with "face-down" of the first chip 11, so that the Au bumps 21 are aligned with the electrode pads 112.

After the bonding, a thermo-setting resin 113 is cast between the first chip 11 and the base film 110, followed by thermo-setting thereof. Subsequently, electric test is conducted to the first chip 11 by using a test instrument connected to the wiring pattern 111.

Figure 4C:
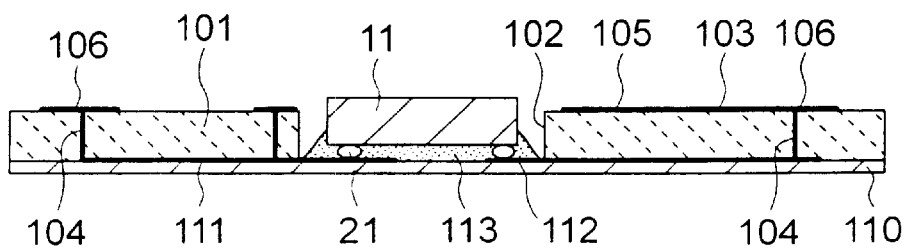
Figure 4D:
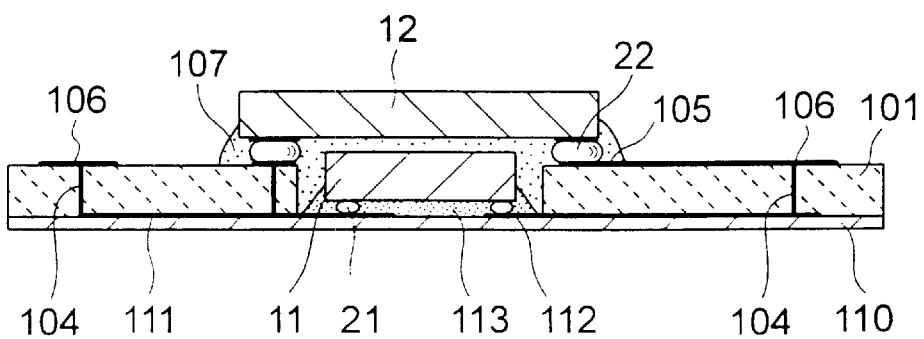

The base film 110 is then aligned with the rigid board 101, as shown in FIG. 4C, followed by heat-pressing thereof to bond the bottom of the via plugs in the through-holes 104 to the electrode pads 112 of the wiring pattern 111. If Au bumps are formed on the electrode pads 112 before the bonding, excellent electric connections can be obtained. Adhesive is also applied between the base film 110 and the first chip 11 for bonding. After the bonding of the base film 110 onto the rigid board 101, the first chip 11 is located at the center of the opening 102.

In an alternative, low-temperature solders, such as Pb—Sn, Sn—Ag and Sn solders, or anisotropic-conductive adhesive resins may be used for connecting the via plugs in the through-holes 104 an the wiring pattern 111 on the base film 110. The latter is more preferable due to a smaller work force because both the mechanical coupling and the electrical connection can be conducted at a time.

Thereafter, Au bumps 22 are formed on the chip electrodes of the second chip 12 similarly to the Au bumps 21 on the first chip 11, are aligned with the electrode pads 105 on the rigid board 101, and are bonded thereto by using a heat-pressing technique, thereby mounting the second chip 22 on the rigid board 101. Then, resin 107 is then cast between the second chip 12 and the rigid board 110, followed by heat-curing thereof. Finally, 0.5-mm-diameter solder balls 13 are formed on the external electrode pads 106 to form the structure of FIG. 3. After final tests, the semiconductor device is delivered for mounting on a mounting board.

Figure 5:
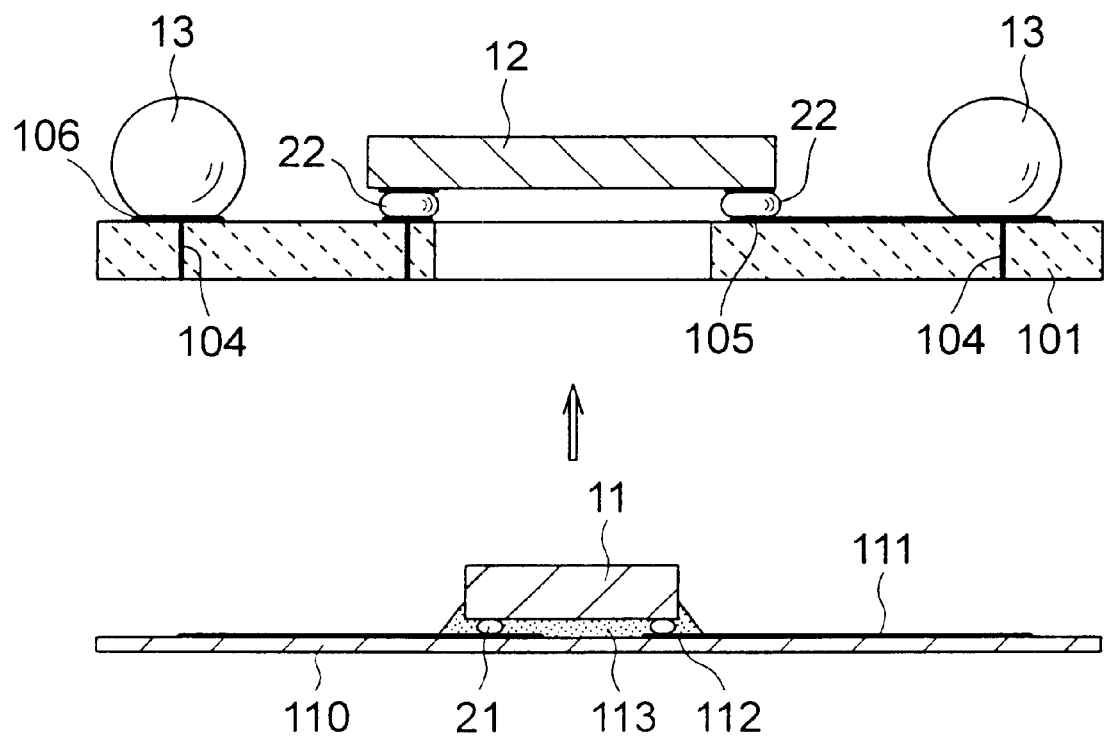
FIG. 5 is a sectional view of the stacked-chip semiconductor device of FIG. 1 during consecutive steps of another fabrication process therefor.

In an alternative, as shown in FIG. 5, the second chip 12 may be mounted on the rigid board 101 and solder balls 13 may be formed on the external electrode pads 106 before bonding the rigid board 101 to the base film 110. By this process, a test instrument may be connected to the wiring pattern 103 on the rigid board 101 for separate tests for the second chip 12 before bonding the base film 110 to the rigid board 101. This increases the yield of the products for the semiconductor device.

The rigid board 101 is not limited to a ceramic board, and may be made of organic material such as glass epoxy resin. In addition, the base film 110 may be made of other materials such as organic materials including glass epoxy resin so long as these materials can be formed as a film. Further, bumps may be made of other materials instead of gold.

In the first embodiment shown in FIG. 3, there is only the base film 110 underlying the opening 102 formed in the rigid board 101. This affords a smaller thickness for the stacked-chip structure of the semiconductor device compared to the conventional structure of FIG. 2. The connections of the chip electrodes of the first and second chips by using the bumps enables the rigid board 101 to have a smaller thickness comparable to the thickness of the first chip 11.

Since the solder balls 13 are formed on the same surface of the rigid board 101 mounting thereon the second chip 12, which has a thickness smaller than the diameter of the solder bumps 13, the overall thickness of the stacked-chip structure is smaller by an amount of the thickness of the second chip 12 than the case where the solder balls 13 are formed on the bottom surface of the semiconductor device. The base film 110 may have a thickness of 50 micrometers, for example. Thus, the stacked-chip structure of the present embodiment achieves an extremely small thickness.

Figure 2:
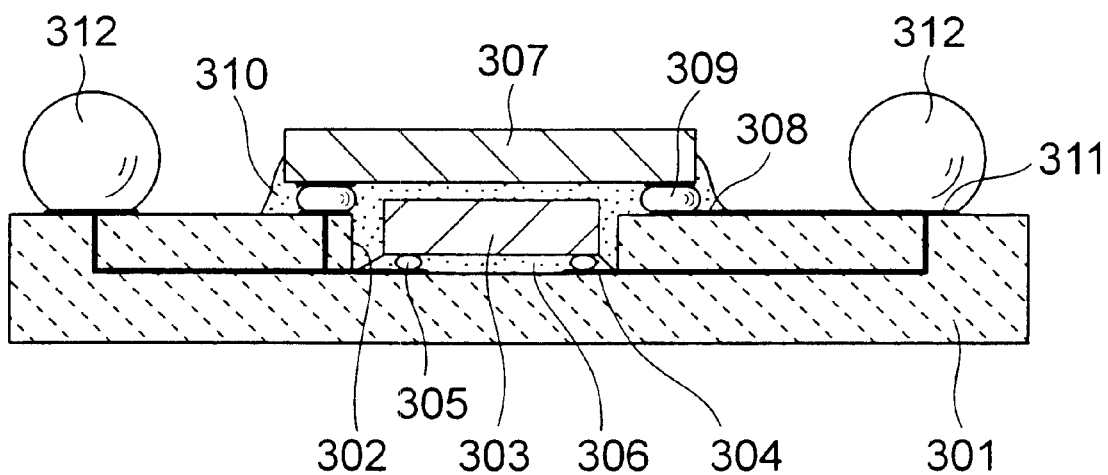
FIG. 2 is a sectional view of another conventional stacked-chip semiconductor device.

Since the rigid board 101 has a large mechanical strength and the base film 110 has a higher flexibility, the overall mechanical strength is not lowered as compared to the conventional semiconductor device of FIG. 2 although the base film 110 has a small thickness. The configuration wherein the chip electrodes of the first chip 11 are connected to the wiring pattern 103 on the rigid board 101 through the wiring pattern 112 on the base film 110 and the through-holes 104 formed in the rigid board 101 affords a smaller area for the connections in the rigid board 101, thereby reducing the planar occupied area of the semiconductor device.

Figure 6:
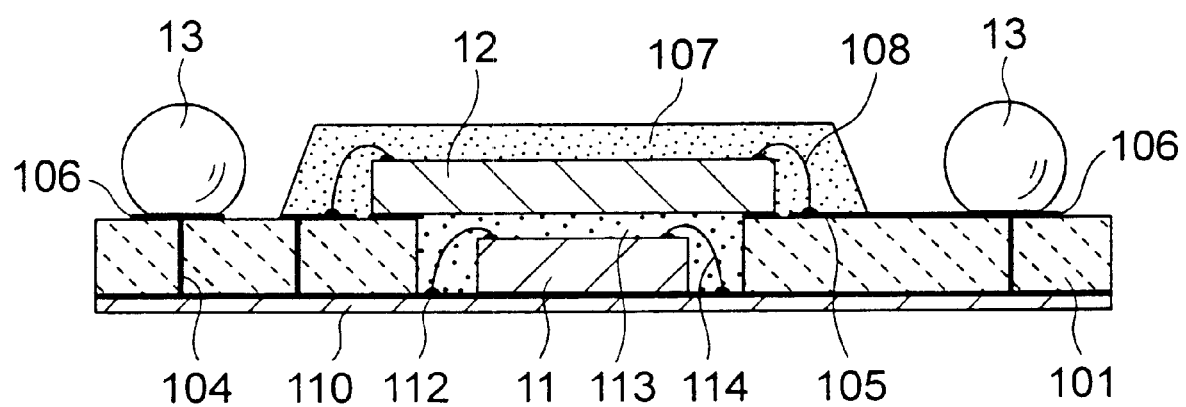
FIG. 6 is a sectional view of a stacked-chip semiconductor device according to a second embodiment of the present invention.

Referring to FIG. 6, a stacked-chip semiconductor device according to a second embodiment of the present invention is similar to the first embodiment except that the first and second chips 11 and 12 are bonded onto the base film 110 and the rigid board 101, respectively, with face-up of the chips, and that the chip electrodes are bonded to the electrode pads 112 and 105 of the rigid board 101 and the base film 110 by using bonding wires 108 and 114 in the second embodiment. During the fabrication step, the wire-bonding is first conducted to the electrode pads 105 and 112 of the rigid board 101 and the base film 110, and then conducted to the chip electrodes. This process can reduce the height of the package mold.

Although the wire-bonding configuration of the present embodiment enlarges the occupied area for the semiconductor device to some extent, this configuration allows a larger pitch to be employed for the electrode pads 105 and 112. In addition, since resin 113 is filled between the second chip 12 and the first chip 11, the second chip 12 is not especially subjected to a pressure rise and damages resulting from the pressure rise during the wire bonding step. Thus, the electrode pads may be located at any sides of the semiconductor chips 11 and 12, which raises design choice of the electric connections for the chips. Further, the bonding wires 108 and 114 afford adjustment of irregularities in the distance between the internal electrode pads and the chip electrodes, which enables any combination of the first and second chips 11 and 12 having a variety of sizes.

In a variation from the first and second embodiments, the bonding technique may be different between the first chip 11 and the second chip 12. For example, the first chip 11 may be bonded by the flip-chip bonding technique whereas the second chip 12 may be bonded by the wire bonding technique, or vice versa.

Since the above embodiments are described only for examples, the present invention is not limited to the above embodiments and various modifications or alterations can be easily made therefrom by those skilled in the art without departing from the scope of the present invention.

What is claimed is:

1. A stacked-chip semiconductor device comprising a rigid insulator board having a first wiring pattern formed on a top surface thereof and an opening formed therein, a base insulator film having a top surface bonded onto a bottom surface of said rigid insulator board, said top surface of said base insulator film mounting thereon a second wiring pattern electrically connected to said first wiring pattern, a first semiconductor chip mounted on said top surface of said base insulator film and received in said opening, said first semiconductor chip having chip electrodes electrically connected to said second wiring pattern, and a second chip mounted on said rigid insulator board overlying said opening and chip electrodes connected to said first wiring pattern, said first wiring pattern including external electrode pads.

2. The stacked-chip semiconductor device as defined in claim 1, wherein said second wiring pattern is connected to said first wiring pattern via through-holes formed in said rigid insulator board.

3. The stacked-chip semiconductor device as defined in claim 2, said first wiring pattern and said second wiring pattern are connected using metallic bumps or soldering at a bottom of said through-holes.

4. The stacked-chip semiconductor device as defined in claim 1, wherein said rigid insulator board and said base insulator film are bonded together by an adhesive.

5. The stacked-chip semiconductor device as defined in claim 1, wherein said rigid insulator board and said base insulator film are bonded together by an anisotropic-conductive resin.

6. The stacked-chip semiconductor device as defined in claim 1, wherein chip electrodes of each of said first and second chips are bonded to electrode pads of said rigid insulator board or said base insulator film by using a flip-chip bonding technique or a wire bonding technique.

7. The stacked-chip semiconductor device as defined in claim 1, wherein said external electrode pads are solder balls or pins.

* * * * *